United States Patent [19]

Shapanus et al.

[11] Patent Number: 5,552,880
[45] Date of Patent: Sep. 3, 1996

[54] OPTICAL RADIATION PROBE

[76] Inventors: Vincent F. Shapanus, 716 Morningside Dr., Towson, Md. 21204; Kevin J. Phipps, 1114 Halstead Rd., Baltimore, Md. 21234

[21] Appl. No.: 472,470

[22] Filed: Jun. 7, 1995

Related U.S. Application Data

[63] Continuation-in-part of Ser. No. 210,027, Mar. 17, 1994.

[51] Int. Cl.$^6$ .............................. G01N 21/00; G01T 1/20; G02B 6/00
[52] U.S. Cl. .................. 356/72; 250/368; 385/12
[58] Field of Search .................... 250/554, 368, 250/390.11, 367; 356/313, 405, 418, 315, 72; 385/115–117, 76, 77, 12, 13

[56] References Cited

U.S. PATENT DOCUMENTS

| | | |
|---|---|---|
| 2,277,814 | 12/1951 | Saunderson et al. . |
| 2,577,815 | 12/1951 | Saunderson et al. . |
| 2,774,276 | 12/1956 | Glasser et al. . |
| 2,951,164 | 8/1960 | Timms . |
| 2,975,785 | 3/1961 | Sheldon . |
| 3,144,551 | 8/1964 | Webb et al. . |
| 3,244,894 | 4/1966 | Steele et al. . |
| 3,407,323 | 10/1968 | Hand . |
| 3,413,481 | 11/1968 | Berry . |
| 3,527,954 | 9/1970 | Hoffman . |
| 3,528,749 | 9/1970 | Bowker . |
| 3,613,062 | 10/1971 | Bloice . |
| 3,636,345 | 1/1972 | Hirschel . |
| 3,684,378 | 8/1972 | Lord . |
| 3,690,772 | 9/1972 | Endl . |
| 3,824,391 | 7/1974 | Noltingk et al. . |
| 3,973,849 | 8/1976 | Jackson et al. . |
| 3,986,777 | 10/1976 | Roll . |
| 4,047,819 | 9/1977 | Goldberg . |
| 4,131,367 | 12/1978 | French et al. . |
| 4,176,369 | 11/1979 | Nelson et al. . |
| 4,280,184 | 7/1981 | Weiner et al. . |
| 4,396,903 | 8/1983 | Habicht et al. . |
| 4,555,800 | 11/1985 | Nishikawa et al. . |
| 4,561,104 | 12/1985 | Martin . |
| 4,575,241 | 3/1986 | Demer et al. . |
| 4,907,281 | 3/1990 | Hirvonen et al. . |
| 4,912,326 | 3/1990 | Naito . |
| 5,000,535 | 3/1991 | Churchill ........................... 385/115 |
| 5,198,666 | 3/1993 | Bateman . |
| 5,313,065 | 5/1994 | Reed ................................... 250/367 |

*Primary Examiner*—K. Hantis
*Attorney, Agent, or Firm*—Reed Smith Shaw & McClay

[57] ABSTRACT

An optical probe for simultaneously detecting radiation emitted from a plurality of different areas of a device. The probe includes a plurality of optical signal acquisition devices. Each of the optical acquisition devices is formed from at least one optical fiber strand having a terminal end portion. The probe includes a hollow longitudinal member with an outer surface having a length and a perimeter perpendicular to the length. The outer surface has a plurality of openings disposed at intervals about the perimeter of the outer surface. Each of the plurality of openings has a different one of the terminal end portions from one of the optical acquisition devices disposed therein. Each of the optical acquisition devices has a different optical field of view corresponding to one of the plurality of different areas of the device.

5 Claims, 5 Drawing Sheets

OPTICAL RADIATION PROBE

This is a continuation-in-part of copending application Ser. No. 08/210,027 filed on Mar. 17, 1994.

FIELD OF THE INVENTION

This invention relates to collecting optical radiation emitted within a device while retaining spatial information representing the position on the device where the radiation was emitted. More particularly, this invention relates to collecting and detecting optical radiation or other radiation converted to optical radiation that is generated at various locations on or in a piece of equipment. Still more particularly, the present invention relates to collecting and detecting neutron, alpha particle, beta particle or gamma ray emissions occurring within a nuclear reactor core. As used herein, "optical radiation" and "light" include visible light and adjacent wavelength ranges of electromagnetic radiation.

BACKGROUND OF THE INVENTION

The parent application to the present invention grew out of the need for an optical collection device that could be inserted into a power utility generator in order to monitor optical radiation emitted by different areas of the generator. The device set forth in the parent application included a position sensitive optical detector coupled to an optical probe. The optical probe detected photons emitted within different fields of view in a single flat plane. It would be desirable when monitoring devices or machines including, without limitation, nuclear reactors, to have an optical probe which could simultaneously monitor multiple fields of view positioned at any angle around the circumference or perimeter of an optical probe. Accordingly, there is a need for a probe which will alter the detection plane of the probe of the parent invention from a flat plane or a sector of a cylindrical plane to any plane desired, such as, for example, a cylindrical plane.

It is therefore an overall object of the present invention to provide a probe for simultaneously acquiring optical radiation from multiple fields of view disposed about a cylindrical plane.

It is a further object of the present invention to provide a probe which can convert any desired radiation to optical radiation, and acquire and transmit the resulting optical radiation.

It is a still further object of the present invention to provide a probe with multiple optical signal acquisition devices that can be attached to one or more position sensitive optical detectors.

The foregoing and other objects and features of the invention will be understood with reference to the following specification and claims and the drawings.

SUMMARY OF THE INVENTION

The present invention is directed to an optical probe for simultaneously detecting radiation emitted from a plurality of different areas of a device. The probe includes a plurality of optical signal acquisition devices. Each of the optical acquisition devices is formed from at least one optical fiber strand having a terminal end portion. The probe also includes a hollow longitudinal member with an outer surface having a length and a perimeter perpendicular to the length. The outer surface has a plurality of openings disposed at intervals about the perimeter of the outer surface. Each of the plurality of openings has a different one of the terminal end portions from one of the optical acquisition devices disposed therein. Each of the optical acquisition devices has a different optical field of view corresponding to one of the plurality of different areas of the device.

DETAILED DESCRIPTION OF THE INVENTION

While the following description may refer specifically to the monitoring of a nuclear reactor, it will be understood that the system of the invention may be used to monitor other machinery and equipment.

Figure 1:
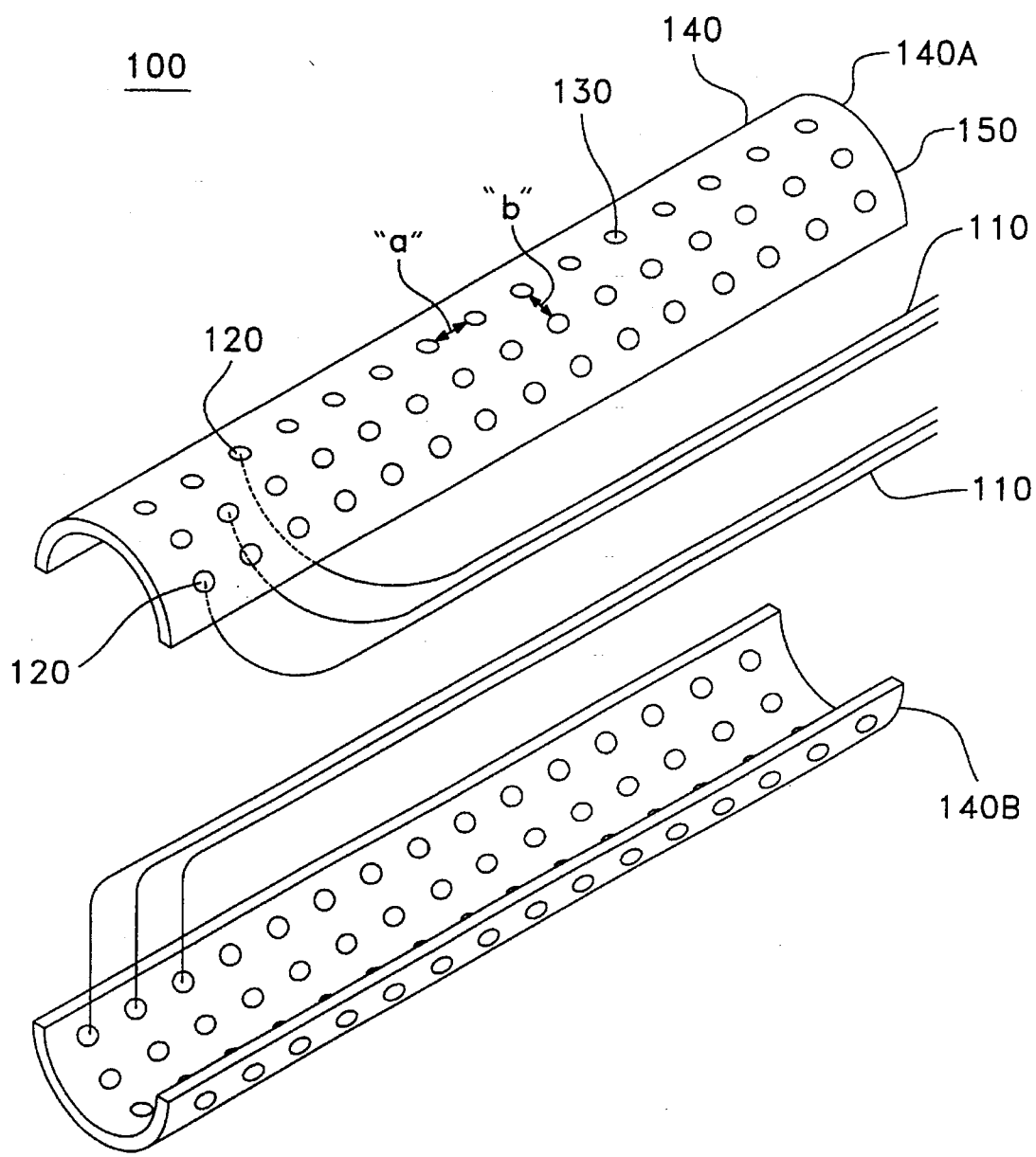
FIG. 1 is a diagram showing a perspective view of an optical probe in accordance with a preferred embodiment of the present invention.

Referring now to FIG. 1, there is shown a diagram illustrating a perspective view of an optical probe 100 in accordance with a preferred embodiment of the present invention. Probe 100 is preferably constructed with a plurality optical fibers 110 having corresponding fiber ends 120. Ends 120 are disposed in corresponding openings 130 in support structure 140. A suitable support structure 140 includes a length of tubing, which may be longitudinally sectioned for convenience in fabrication to provide an upper portion 140A and a lower portion 140B. The tubing is preferably made of a thermal resistant material, and a steel or a carbon steel alloy material is suitable. Z Optical fibers 110 are assembled in tubing 140 with the terminal ends 120 of the fibers at a predetermined longitudinal spacing "a" and at a predetermined circumferential spacing "b." A terminal end 120 of each fiber is inserted into a preexisting radial hole 130 in the tubing 140, a plurality of such holes 130 being provided at a spacing "a" so as to establish the spacing of fiber ends 120 along the length of the probe, and a plurality of such holes 130 being provided at a spacing "b" so as to establish the spacing of fiber ends 120 about the circumference (or perimeter) of the probe. The top half section of the tubing 140A is then attached to the bottom half 140B. The tubular member 140 thus formed is then "potted" or filled with a nonconductive material to fill all voids between fibers and give the assembled probe structural integrity. So constructed, the detecting fibers are incorporated into a unitary, self-contained, integral, sensor-containing structure such as is commonly referred to in instrumentation as a "probe", as distinguished from an assemblage of mechanically separate components. Polyurethane and epoxy are suitable materials for filling the voids in the probe structure, if necessary. The elongated cylindrical probe 100 so constructed may be made with a sufficiently small diameter as to easily fit within a nuclear reactor core and sufficiently rugged to survive in such a hostile environment. Such a probe 100 permits sensitive detecting equipment to be remotely mounted in a less hostile environment.

Although in the preferred embodiment of FIG. 1, a single optical fiber 110 is used at each opening 130 as a separate optical acquisition device, a plurality of optical fibers which effectively function as a single fiber may alternatively be disposed in each opening 130. Thus, for purposes of the present invention, a plurality of fibers within a single opening 130 may be referred to simply as a fiber 110.

The fibers 110 are brought out of an exit end 150 of the probe 100 which may be provided with probe-mounting or fiber conduit-interfacing structures as desired. Commercially available optical fiber cables are conveniently used in the probe structure; such cables include a plurality of individual optical fibers which are enclosed within protective jacketing. Applicant believes that a glass or quartz optical fiber material such as that supplied by Fiberguide Industries under its stock number SFS600/660-T, which is a cable containing a plastic fiber in a jacket with a diameter of 0.69 mm, would be suitable. No doubt many other optical fibers are suitable. If attenuation losses are substantial, glass fibers may be preferable. The 0.69 mm strand diameter of the referenced optical fiber material is believed suitable for use as a single fiber 110, both in terms of the light collection area of the strand end and the ruggedness and ease of handling it provides. Such a fiber material may be brought in its jacket to or through a hole 130. If a multiple-fiber cable is to monitor plural areas—for instance, if each fiber from a multi-fiber strand is to monitor one of multiple separate areas—then each of the fibers 110 of the strand must be separated from the bundle in order to be disposed within its radial hole 130. In that arrangement a jacketed portion of the cable may extend partially within the probe at the exit end 150 so as to be surrounded by potting material and provide a rugged connection between the cable and the probe. If it is desired to detect photons in the visible spectrum, glass or plastic fibers are adequate. If the application requires ultraviolet detection, quartz fibers are necessary. If the application requires infrared detection, sapphire fibers are required. Another arrangement can also include all three types of fibers so that the probe is capable of transmitting all optical wavelengths ranging from infrared through visible to ultraviolet light.

Figure 2:
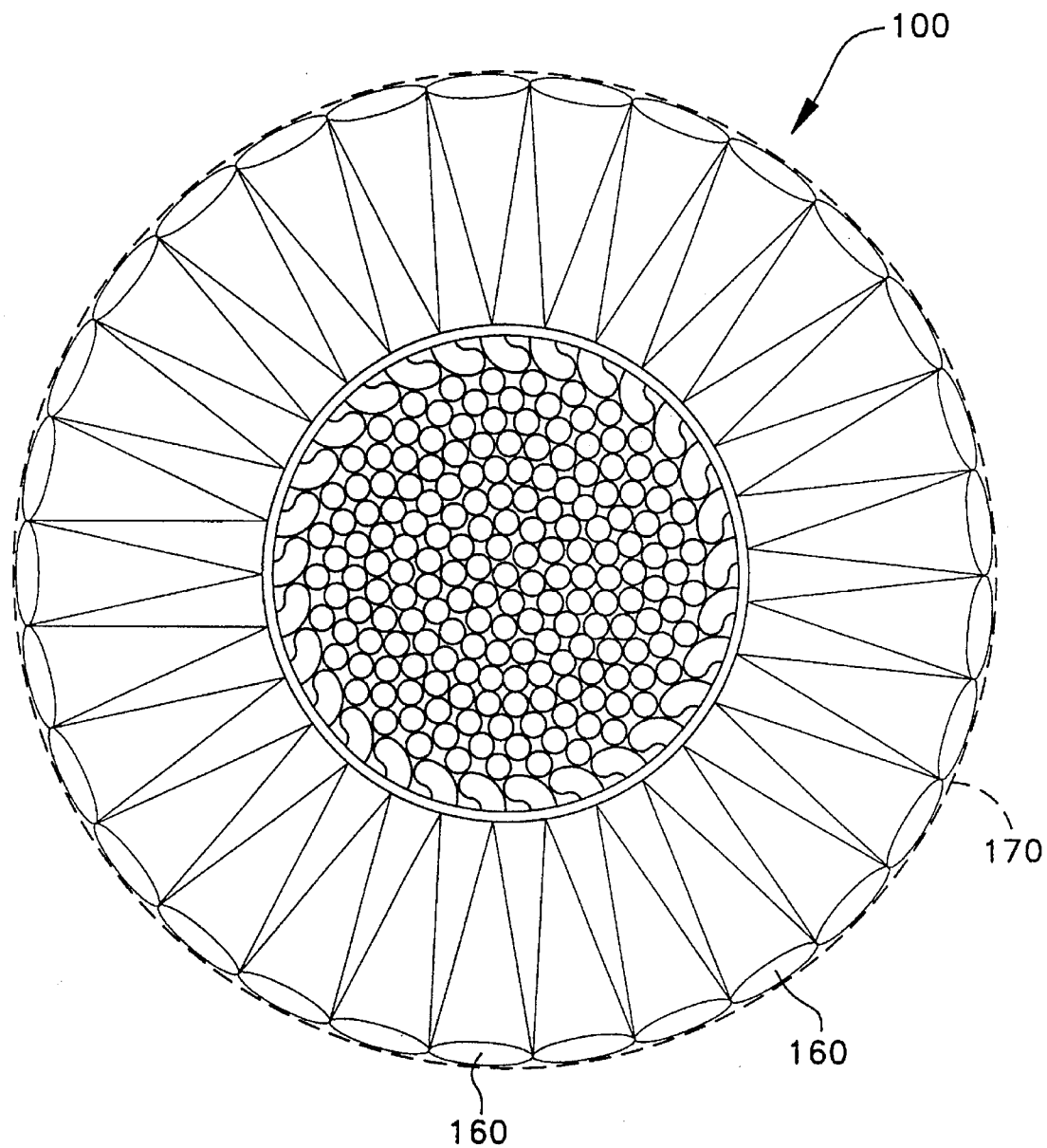
FIG. 2 is a cross-sectional view of a first preferred optical probe having multiple optical acquisition devices disposed to acquire optical radiation from multiple fields of view lying along a cylindrical plane in accordance with a preferred embodiment of the present invention.

Referring now to FIG. 2, there is shown a cross-sectional view of optical probe 100 having multiple optical acquisition devices (or fibers) 110 disposed to acquire optical radiation from multiple fields of view 160 lying along a cylindrical plane 170 in accordance with the present invention. Each fiber end 120 defines an aperture through which light may be admitted into a fiber 110. Each fiber 110 has a given ability to collect, and to convey through its length, photons that have optical paths that lie completely in a cone which has its apex at the fiber end 120 and its base at the cylindrical surface 170. This cone is referred to as the acceptance cone of the fiber, and the angle of the acceptance cone is referred to as the acceptance angle. Cylindrical surface 170 may, for example, correspond to a surface within a nuclear reactor core.

The acceptance cone angle and the separation between the fiber ends 120 and the monitored surface 170 determine the area covered by each fiber, i.e. the area on the surface 170 from which it collects photons. It is generally desirable to cover substantially the entire area of the monitored surface.

For a given acceptance angle, surface area to be monitored, and probe separation from the monitored surface, the separation between fiber ends and the number of fibers required for substantially complete coverage is determined. The fiber ends 120 will normally be flat surfaces, but in order to modify the acceptance cone angle they may be terminated with a curved surface or provided with auxiliary optics. In the preferred arrangement shown in FIG. 2, the end 120 of each fiber is positioned at a distance "b" from the end 120 of the adjacent fibers so that the base of each acceptance cone is generally tangent to the adjacent base. To minimize the number of fibers while obtaining substantially total coverage around surface 170, the separation between the ends 120 of the fibers and the surface 170 is maximized to the extent permitted by the desired spatial resolution.

Figure 3:
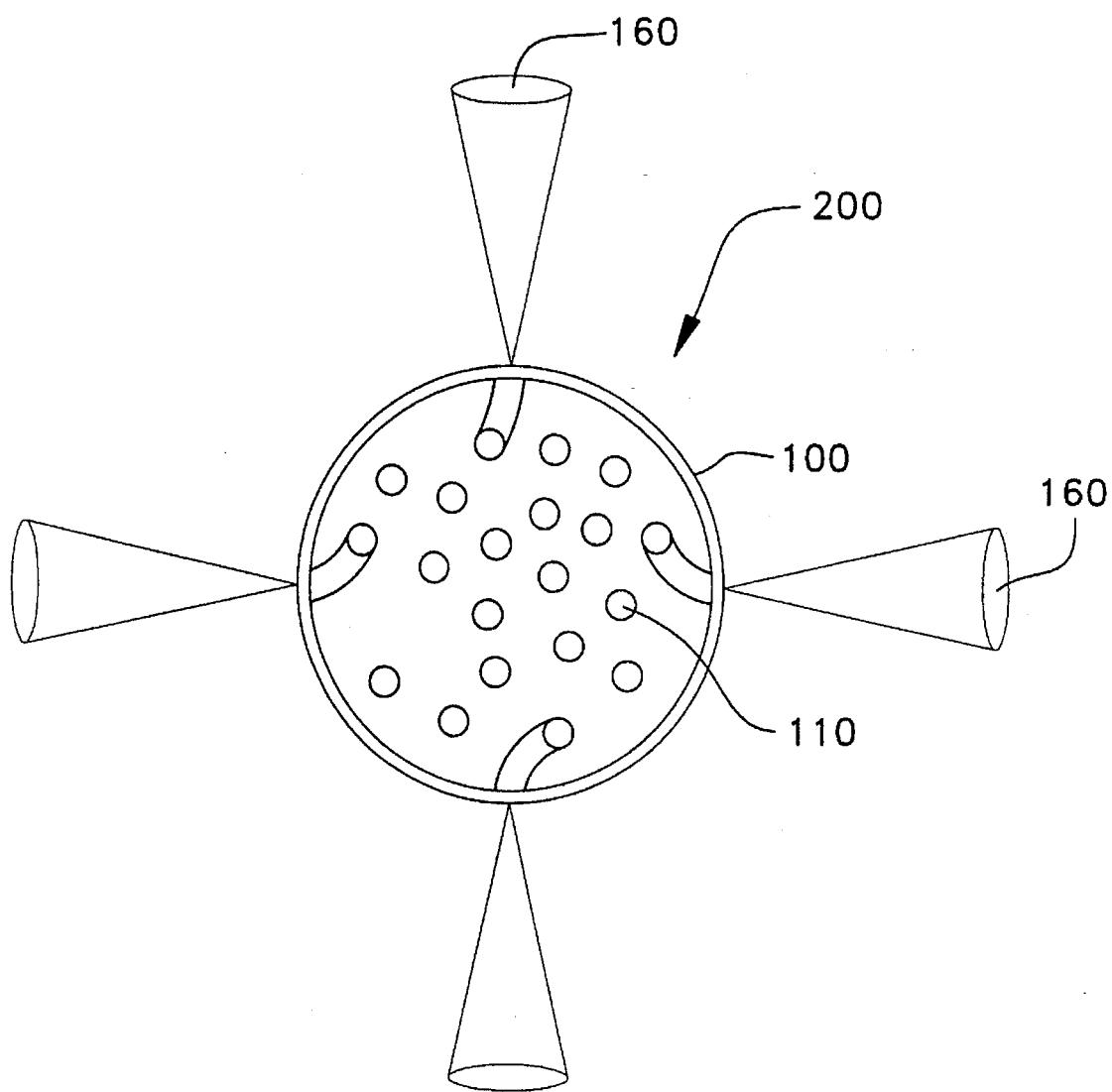
FIG. 3 is a cross-sectional view of a second preferred optical probe having multiple optical acquisition devices disposed to acquire optical radiation from multiple fields of view lying along a cylindrical plane in accordance with a further preferred embodiment of the present invention.

Referring now to FIG. 3, there is shown a cross-sectional view of an alternative preferred optical probe 200. Optical probe 200 is substantially identical to optical probe 100, except the spacing between adjacent ends 120 about the circumference of surface 170 is increased in probe 200. Thus, in probe 200, the acceptance cones of fiber ends 120 are spaced apart and do not lie tangent to each other.

In order to provide position information regarding optical radiation sensed by each fiber 110, the system of the present invention must be able to correlate a detected optical signal with the location of a particular probe fiber which acquired the detected light. This may be accomplished by controlling the routing of the fibers between the probes and the detectors so that a fiber from a predetermined probe location is made to illuminate a particular detector area. Alternatively, and preferably, the fibers may be routed in a random or uncontrolled manner, and the correlation between probe location and detector location determined afterward by selectively illuminating single probe fibers and determining which detector locations respond. Data obtained in this process may be stored in a lookup table or the like and thereafter used during monitoring to associate detector outputs with equipment locations. A suitable system for detecting and monitoring optical signals from each fiber 110 in probe 100 is disclosed in co-pending U.S. patent application No. (08/487,956), filed simultaneously herewith, entitled "Method and Apparatus for Optically Monitoring an Electrical Generator," the contents of which are hereby incorporated herein in their entirety by reference.

Figure 4:
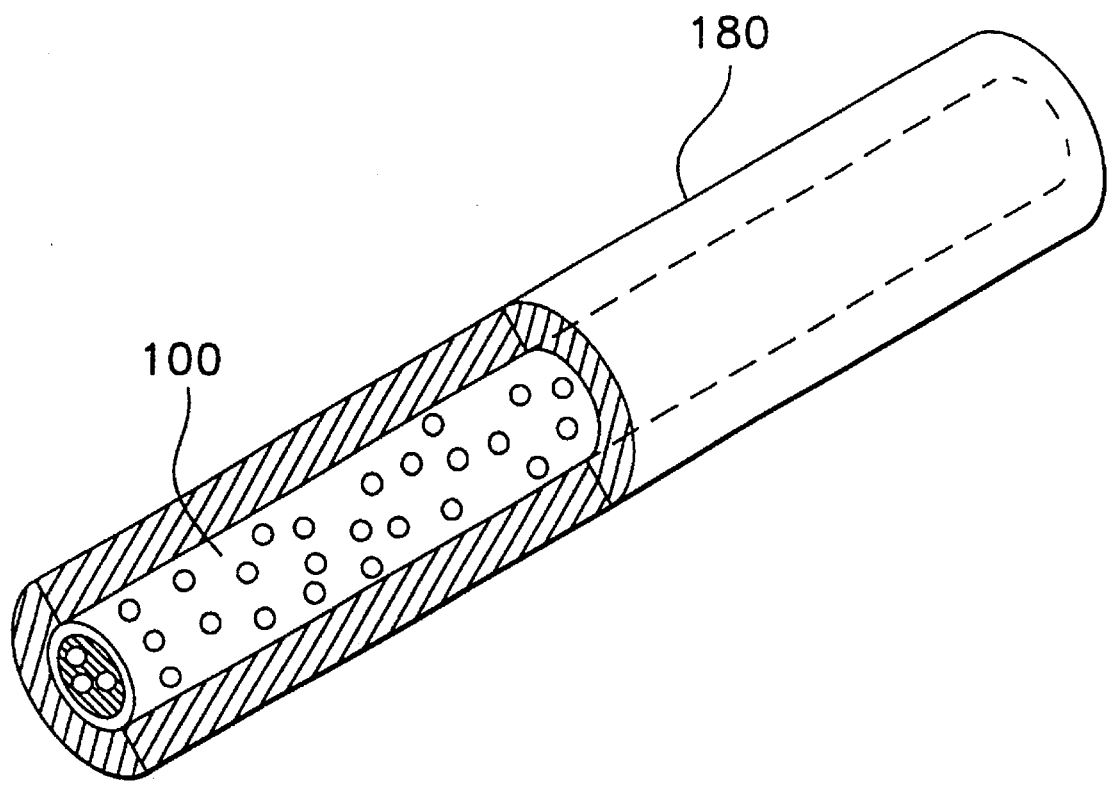
FIG. 4 is a diagram showing an optical probe surrounded by a scintillation sleeve in accordance with a preferred embodiment of the present invention.

Referring now to FIG. 4, there is shown a diagram of optical probe 100 surrounded by a scintillation sleeve 180 in accordance with a preferred embodiment of the present invention. The purpose of scintillator sleeve 180 is to convert emissions such as, for example, gamma ray emissions occurring within a nuclear reactor core, which are not within the visible spectrum, to visible optical radiation which can be detected and acquired by fibers 110 of probe 100. Thus, when used in conjunction with scintillator sleeve 180, probe 100 can be used to detect and monitor both visible and non-visible radiation. When scintillator sleeve 180 is used to permit probe 100 to detect gamma ray emissions, scintillator sleeve 180 is preferably formed of a steel annular container filled with sodium iodide with a trace of thalium iodide, or any other suitable material.

Figure 5:
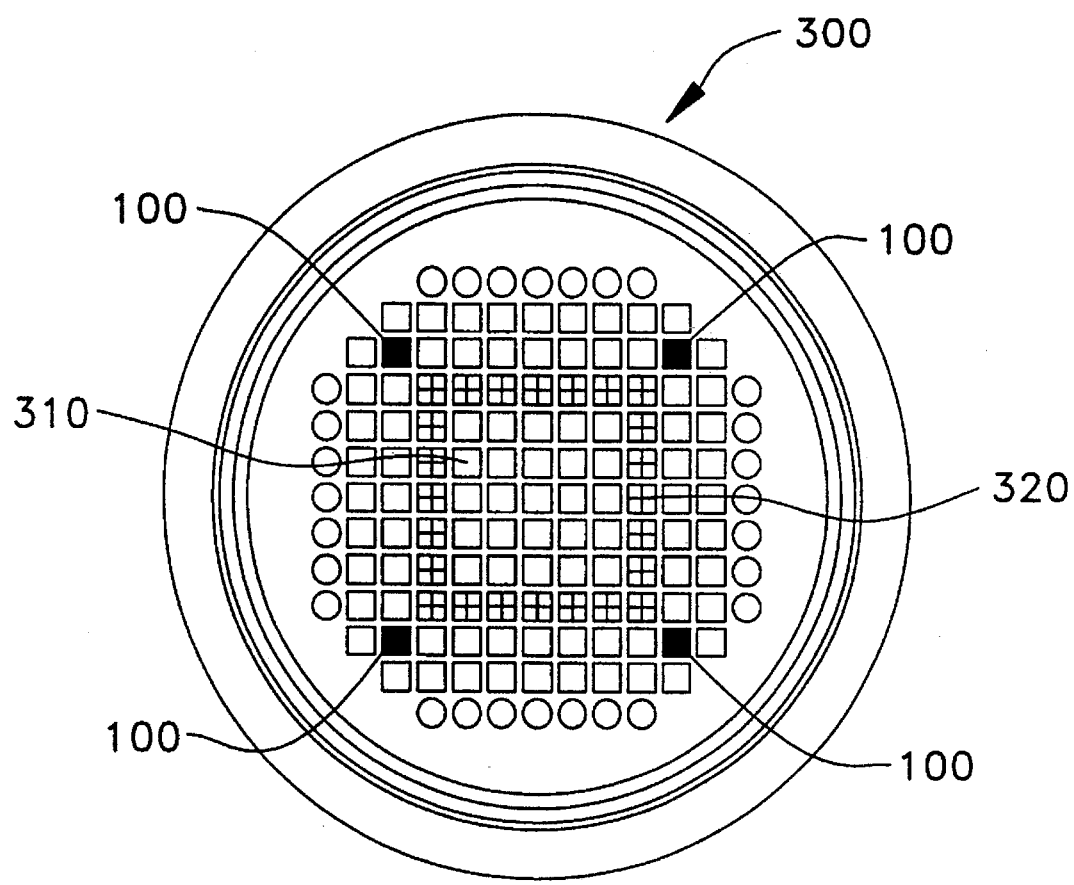
FIG. 5 is a top view showing the placement of an optical probe in a nuclear reactor core in accordance with a preferred embodiment of the present invention.

Referring now to FIG. 5, there is shown a top view showing the placement of optical probes 100 within a nuclear reactor core 300 in accordance with a preferred embodiment of the present invention. The optical probes 100 are preferably each surrounded with a scintillation sleeve 180. Probes 100 are preferably interspersed within core 300 among fuel rods 310 and control rods 320. During operation of reactor core 300, gamma rays which pass through sleeve 180 are converted to light which can then be detected by the fibers within probes 100 in order to monitor emissions within core 300. For other non-hostile systems, other scintillators can be used to detect fast neutrons, alpha particles and beta particles.

Changes and modifications to fit particular operating requirements and environments will be apparent to those skilled in the art. The invention is not to be considered limited to the examples chosen for the purpose of illustration and includes all changes and modifications which do not constitute a departure from the true spirit and scope of the invention.

What is claimed is:

1. An optical probe for simultaneously detecting radiation emitted from a plurality of different non-overlapping areas of a device, comprising:

(A) a plurality of optical signal acquisition devices each of which is formed from at least one optical fiber strand having a terminal end portion; and (B) a hollow tubular member with an outer cylindrical surface having a length and a perimeter perpendicular to said length, said outer cylindrical surface having a plurality of openings disposed at intervals about said perimeter, each of said plurality of openings having a different one of said terminal end portions from one of said plurality of optical acquisition devices disposed therein; wherein each of said plurality of optical acquisition devices has a different optical field of view corresponding to one of said plurality of different non-overlapping areas.

2. The optical probe of claim 1, further comprising a tubular scintillation sleeve positioned around said outer cylindrical surface of said hollow tubular member for converting said radiation to visible light.

3. The optical probe of claim 2, wherein said plurality of optical acquisition devices collectively have a field of view covering a cylindrical plane surrounding said outer cylindrical surface of said hollow tubular member.

4. The optical probe of claim 3, wherein said radiation is representative of neutron, alpha particle or beta particle emissions.

5. The optical probe of claim 4, wherein said device is a nuclear reactor core and said radiation is representative of gamma ray emissions.

* * * * *